United States Patent [19]

Guillaume et al.

[11] Patent Number: 4,581,537

[45] Date of Patent: Apr. 8, 1986

[54] METHOD FOR GENERATING INSPECTION PATTERNS

[75] Inventors: Wallace J. Guillaume, Poughkeepsie; John F. Loughran, Stormville; Jan Rogoyski; Robert A. Simpson, both of Wappingers Falls; Edward V. Weber, Poughkeepsie, all of N.Y.

[73] Assignee: International Business Machines Corporation, Armonk, N.Y.

[21] Appl. No.: 592,986

[22] Filed: Mar. 23, 1984

[51] Int. Cl.$^4$ ............................................. H01J 37/00
[52] U.S. Cl. ............................... 250/491.1; 250/492.2
[58] Field of Search .................... 250/491.1, 492.2, 398

[56] References Cited

U.S. PATENT DOCUMENTS

| | | | |
|---|---|---|---|
| 4,219,731 | 8/1980 | Migitaka et al. | 250/310 |
| 4,357,540 | 11/1982 | Benjamin et al. | 250/491.1 |
| 4,365,163 | 12/1982 | Davis et al. | 250/491.1 |
| 4,475,037 | 10/1984 | Vettiger et al. | 250/252.1 |
| 4,494,004 | 1/1985 | Mauer, IV et al. | 250/492.2 |

OTHER PUBLICATIONS

Wilson et al., Automatic Elec. Beam Fabrication of Micron-Size Devices, Scanning Electron Microscopy, Apr. 1976, pp. 659–668.

IBM TDB, vol. 22, No. 12, May 1980, "Mask Inspection Using Electron-Beam Systems", W. D. Grobman, p. 5540.

J. Vac. Sci. Technol., 20(1), Jan. 1982, "An Automated VLSI-Mask Inspection System", M. Migitaka, K. Mizukami, Y. Hisamoto, and Y. Wada, pp. 26–32.

J. Vac. Sci. Technol., 19(1), May/Jun. 1981, "Studies on an Electron-Beam Mask-Defect Inspection", Y. Wada, Y. Hisamoto, K. Mizukami, and M. Migitaka, pp. 36–39.

Proceedings of SPIE-The International Society for Optical Engineering, vol. 334, Mar. 31–Apr. 1, 1982, Santa Clara, California, "Detecting Submicron Pattern Defects on Optical Photomasks Using an Enhanced EL-3 Electron-Beam Lithography Tool", R. A. Simpson, D. E. Davis, pp. 230–237.

Primary Examiner—Bruce C. Anderson
Assistant Examiner—Paul A. Guss
Attorney, Agent, or Firm—Douglas A. Lashmit; Mitchell S. Bigel

[57] ABSTRACT

A method of forming inspection patterns for inspecting a workpiece, e.g., for electron beam inspection of optical photomasks. The inspection patterns are formed from the workpiece patterns themselves by applying a first positive windage to the workpiece patterns, inverting the first positive windaged workpiece patterns and applying a second positive windage to the inverted first positive windaged workpiece patterns. The inspection patterns so produced will contain the requisite guard band and the requisite overlap of abutting patterns.

6 Claims, 21 Drawing Figures

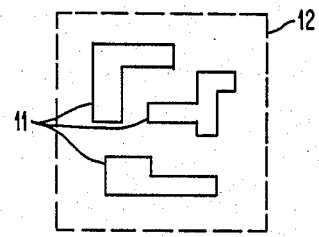
FIG. 1A
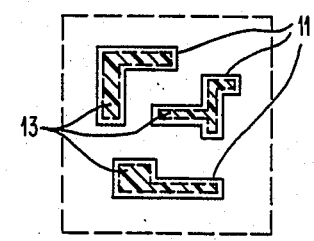
FIG. 1B
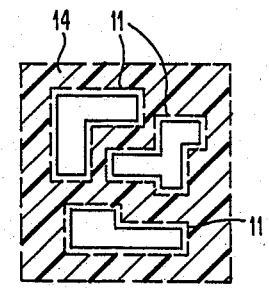
FIG. 1C
FIG. 1
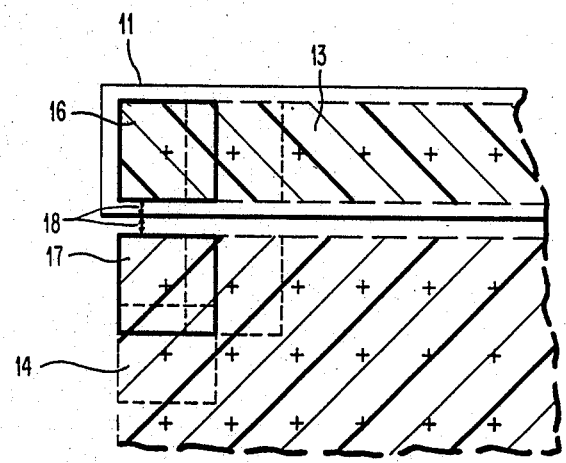
FIG. 2

D1: X1, Y1, W1, H1
D2: X2, Y1, W2, H2

R1: X0, Y1+H1, W0, H0 - (Y1+H1)
R2: X0, Y1, X1-X0, H1
R3: X0, Y0, W0, Y1-Y0
R4: X1+W1, Y1, W0-(W1+(X1-X0)), H1

R1: X0, Y1+ H1, W0, H0-(Y1+H1)
R2: X0, Y1, X1-X0, H1
R3: X0, Y0, W0, Y1-Y0
R5: X1+W1, Y1+H2, W0-(W1+(X1-X0)), H1-H2
R6: X2+W2, Y1, W0-(W1+(X1-X2))-W2

METHOD FOR GENERATING INSPECTION PATTERNS

BACKGROUND OF THE INVENTION

1. Technical Field

This invention relates to a method of generating inspection patterns for inspecting a patterned workpiece, e.g., for electron-beam inspection of optical photomasks.

It is well known that photomasks are used for exposing patterns onto a radiation sensitive layer formed on an integrated circuit during the fabrication thereof. The patterned photomask itself may be fabricated by selective irradiation with a focussed electron beam or other selective irradiation source. Light or other suitable radiation may then be projected through the photomask and onto a radiation sensitive layer on an integrated circuit, to produce an image of the photomask pattern in the radiation sensitive layer. In the current state of the art, photomask patterns for integrated circuit chips are becoming increasingly complex. Defects in the masks thus become significant contributors to yield and reliability losses. Accordingly, inspection of photomasks for defects is necessary.

2. Background Art

An inspection technique for optical photomasks using a direct write electron beam lithography tool is described in the publication "Detecting Submicron Pattern Defects on Optical Photomasks Using an Enhanced EL-3 Electron-Beam Lithography Tool" by R. A. Simpson et al., Proceedings of the International Society for Optical Engineering, Vol. 334, pages 230-237, 1982, the disclosure of which is incorporated herein by reference; and in U.S. Pat. No. 4,365,163 to Davis et al. entitled "Pattern Inspection Tool—Method and Apparatus", the disclosure of which is incorporated herein by reference. These references disclose a technique for deriving inspection patterns from the mask patterns themselves so that character or pattern recognition is not required to inspect the mask patterns. The inspection patterns may be generated by software from the original design data which was used to fabricate the mask patterns. As disclosed, in order to inspect a mask pattern, clear and opaque inspection patterns are required. Fixed-size overlapped electron beam spots are stepped over the mask as defined by the inspection pattern while a signal derived from the backscattered electrons is monitored to detect mask pattern defects. As pointed out, the clear and opaque inspection patterns are essentially shrunken forms of positive and negative versions of the mask patterns where the shrink provides a guard band that prevents mask and system tolerances from producing a false indication of pattern defects. As also pointed out, the inspection spots must overlap in order to provide proper defect detection probability.

The above mentioned dual requirements for inspection patterns, i.e., guard banding and overlapping, make it difficult to efficiently generate these inspection patterns from the mask pattern design data. More particularly, the mask pattern design data is typically expressed as a series of primitive shapes; e.g., a series of rectangles. When a mask pattern can be described in terms of isolated or non abutting primitive shapes, it is easy to provide the requisite guard banding by a well known process called windaging. A positive windage expands each dimension of a shape while a negative windage shrinks each dimension of a shape, thus providing the requisite guard banding outside or inside the primitive shape. However, if, as is typically the case, abutting primitive shapes are required to define a mask pattern, e.g., the mask pattern is a polygon which must be described as a series of abutting rectangles, then application of negative windage for guard banding purposes will separate the primitive shapes leaving a gap therebetween, and this gap will not be inspected.

In theory, a sorting technique may be devised to search for all abutted primitive shapes in the mask pattern design data, and then, after windaging, to somehow expand the primitive shapes to rejoin them. Such a search and expand technique would be extremely time-consuming in terms of computer time because it would involve a comparison of each primitive shape with every other primitive shape in order to search for abutting shapes. Such a search and expand technique also would have to provide an overlap between abutting primitive shapes in order to ensure the requisite inspection spot overlap where the primitive shapes abut.

SUMMARY OF THE INVENTION

It is accordingly an object of the invention to provide an efficient method of generating inspection patterns for a patterned workpiece.

It is another object of the invention to provide a method of generating inspection patterns from the workpiece pattern itself, with the inspection patterns providing the requisite guard banding and overlap.

It is a further object of the invention to provide a method of generating inspection patterns which provide the requisite overlap and guard banding without the use of search and sort techniques to rejoin and overlap abutting primitive shapes.

These and other objects of the invention are achieved by a method of forming inspection patterns from workpiece patterns by applying a first positive windage to the workpiece patterns, inverting the first positive windaged workpiece patterns and applying a second positive windage to the inverted first positive windaged workpiece patterns. The above three steps are performed on all of the primitive shapes which comprise the workpiece pattern design data, regardless of whether the primitive shapes abut, and will result in all of the workpiece inspection patterns having a guard band and the requisite overlap. The amount of guard banding and overlap may be controlled by controlling the relative amounts of the first and second windages.

In a preferred embodiment of the invention, the workpiece pattern is described as a series of rectangles, some of which abut to form polygons. The inspection pattern is generated by applying a first positive windage to each rectangle, thereby increasing the length of each side of each rectangle by the windage value. The first positive windaged workpiece patterns are then inverted, i.e., a negative version of the pattern is created, with the area which was previously in the pattern now being out of the pattern and vice versa. Inversion may be likened to the formation of a complementary pattern, with those areas which were previously inside the pattern now being outside the pattern and vice versa. The inverted, positive windaged patterns are then subjected to a second positive windage, and the resultant series of rectangles forms the inspection pattern.

Although the invention is described in detail with regard to photomasks, it will be understood that the invention may be employed to inspect other patterned workpieces, e.g., to inspect a conductive or other pattern on a semiconductor integrated circuit, a printed circuit board or other integrated circuit packaging substrate. It will also be understood that optical, infrared, X-ray or other selective irradiation sources may be employed for inspection purposes.

The inspection pattern generated according to the invention may be applied to the deflection generator of a shaped spot electron beam column, having the mask to be inspected placed in the target area thereof. Shaped overlapped spots are stepped over the mask in a pattern defined by the inspection pattern, and the signal derived from the backscattered electrons is monitored, to detect defects, as described in the above cited publication by Simpson et al. and U.S. Pat. No. 4,365,163 to Davis et al.

BRIEF DESCRIPTION OF THE DRAWING

FIG. 1 illustrates examples of inspection patterns required for inspecting an optical photomask.

FIG. 2 illustrates placement of overlapping inspection spots as defined by inspection patterns.

DETAILED DESCRIPTION OF THE INVENTION

Figure 3A:
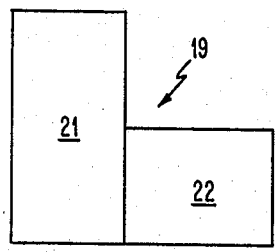
FIG. 3 illustrates the problem of generating inspection patterns from mask patterns which include abutting primitive shapes.

Referring now to FIG. 1 there is illustrated a simplified example of a photomask pattern (FIG. 1A), and the inside and outside inspection patterns (FIGS. 1B and 1C, respectively) required to inspect the mask pattern of FIG. 1A. The photomask pattern of FIG. 1A comprises three polygons 11 within a given photomask subfield 12, however, it will be understood by those having skill in the art that typical photomask patterns are much more complicated than illustrated in FIG. 1A. The area inside polygons 11 may be either clear or opaque mask regions. Referring to FIG. 1B, it will be seen that the inside inspection pattern 13 is a shrunken version of photomask pattern 11. The shrink provides a guard band for preventing misalignment or tool erros from causing false indications of pattern defects. Referring to FIG. 1C, it will be seen that the outside inspection pattern 14 is an expanded version of phgotomask pattern 11 to provide a guard band. Complete inspection of a mask pattern requires production of inside and outside inspection patterns.

Referring now to FIG. 2, there is illustrated the stepping of fixed size overlapping electron beam spots over the area defined by the inspection patterns in order to inspect the photomask. The spots are overlapped so that in the set of inspection spots, at least one inspection spot will substantially coincide with the area of a defect, resulting in a large deviation from the expected signal level. Thus, for representative photomask pattern 11, a plurality of electron beam spots 16 are stepped over the area defined by inside inspection pattern 13. Likewise, a series of overlapping spots 17 is stepped over the area defined by the outside inspection pattern 14. As shown in FIG. 2, spots 16 and 17 must overlap and provide the requisite guard band 18.

Figure 3B:
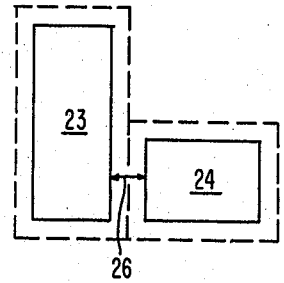

Referring now to FIG. 3, the problem of generating inspection patterns from the mask patterns is illustrated. The problem occurs when the mask pattern design data is expressed as a series of abutting primitive shapes. More particularly, referring to FIG. 3A, a portion of a photomask pattern is illustrated. The photomask portion is an L-shaped segment 19 comprising abutting rectangles 21 and 22. In order to provide the requisite guard band for inspecting the area inside rectangles 21 and 22, a negative windage may be applied to each rectangle. As shown in FIG. 3B, the resultant negative windaged rectangles 23 and 24 will have a gap 26 therebetween. This gap will not be inspected because the inspection patterns 23 and 24 define the area over which fixed size electron beam spots are stepped.

Figure 3C:
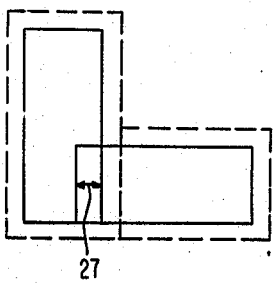

FIG. 3C illustrates one solution to the problem. The solution would involve a search and sort algorithm which searches for all abutting primitive shapes in the photomask pattern, and after negative windage, expands the primitive shapes to rejoin them. As was stated above, such a search and expand technique is extremely time consuming in that it involves comparison of each primitive shape with every other primitive shape. Also, some means would have to be provided to ensure that the inspection patterns overlap at 27, to ensure that the stepped electron beam spots will overlap where the primitive functions abut.

Figures 4, 5, 5A, 5B, 5C, 5D, 5E:
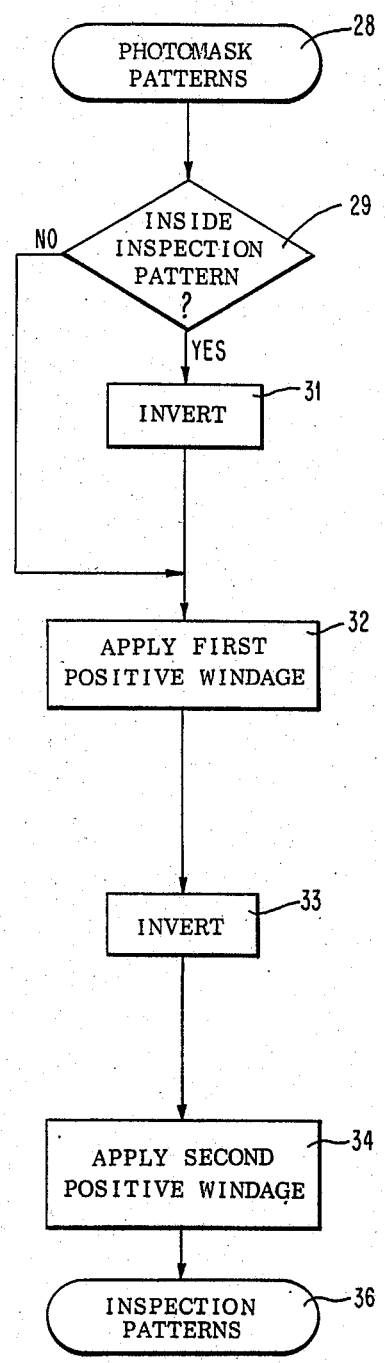
FIG. 4 illustrates a method for generating inspection patterns from mask patterns according to the present invention.
FIG. 5 illustrates operation of the method of FIG. 4 on a mask pattern which includes abutting primitive shapes.
Figure 6:
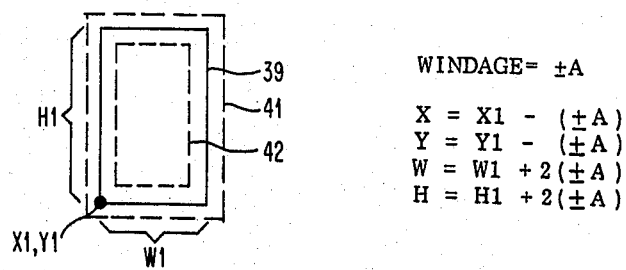
FIG. 6 geometrically illustrates the windaging operation.

Referring now to FIG. 4, there is shown a method of generating inspection patterns from mask patterns according to the present invention. Referring to FIG. 4, the method operates on photomask patterns (block 28). The photomask patterns are expressed in terms of a series of primitive shapes, e.g., a series of rectangles. Each rectangle may be expressed in terms of an X-Y coordinate of the lower left hand corner plus a length and width, as illustrated in FIG. 6 below. It will be understood by those having skill in the art that the method of the present invention may be practiced by a computer program, residing in the digital control processor for the electron beam column or in a general purpose data processor. According to the invention, the computer program operates on the primitive functions to produce a series of inspection patterns. The inspection patterns are applied to the deflection generator or beam controller of the electron beam system, to provide the requisite series of overlapping inspection spots.

The method of the present invention may be employed for generating inside and outside inspection patterns. If the photomask pattern data describes a clear mask region, then the inside inspection patterns are used to inspect the clear mask regions and the outside inspection patterns are used to scan the opaque mask regions. If, on the other hand, the inside photomask pattern data describes an opaque mask region, then the inside inspection patterns are used to scan the opaque mask regions, while the outside inspection patterns are used to scan the outside regions.

In order to produce the inside inspection patterns (block 29), an additional step is required over the steps for producing the outside inspection patterns. This additional step is an inversion shown at block 31. The inversion operation complements the data being operated upon by creating a negative version of the pattern. The details of the inversion process will be described with respect to FIGS. 8 and 9 below.

After the preliminary inversion step (block 31) for inside inspection patterns, the method proceeds as follows: a first positive windage (block 32) is applied to all of the photomask patterns (or inverted photomask patterns). A method for applying positive windage is described with reference to FIG. 7 below. Then, the first positive windaged photomask patterns are inverted (block 33). A second positive windage (block 34) is then applied. The result of the first positive windage, inversion and second positive windage steps is a series of inspection patterns (block 36) which may be used to inspect the inside or outside areas of the photomask pattern.

FIG. 5 illustrates how the method of FIG. 4 operates on an L-shaped photomask pattern (FIG. 5A). FIG. 5B illustrates the inversion corresponding to FIG. 4 block 31, for forming the inside inspection pattern. FIG. 5C illustrates application of a first positive windage corresponding to FIG. 4 block 32. FIG. 5D illustrates the inversion corresponding to FIG. 4 block 33. Finally, FIG. 5E illustrates application of a second positive windage corresponding to block 34 of FIG. 4. The resulting inspection pattern of FIG. 5E is seen to include the requisite guard band 37, and the requisite overlap 38 of primitive shapes where they abut. The rectangle date corresponding to FIG. 5E is applied to the deflection generator of an electron beam column for stepping of overlapped square spots over a mask in a manner described above. It will be understood by those having skill in the art that focussed optical, X-ray, ion or other beams may likewise be employed.

According to the present invention, the amount of overlap and guard band may be independently varied by varying the amounts of the first and second positive windages. The formulas for calculating the windage values based upon the requisite guard band and overlap are as follows:

Windage 1=Guard Band+(0.5) (Overlap)   (1)

Windage 2=(0.5) (Overlap)   (2), where;
Windage 1 is the amount of first positive windage applied to each rectangle side in FIG. 4 block 32;
Windage 2 is the amount of second positive windage applied to each rectangle side in FIG. 4 block 34;
Guard Band is the requisite guard band; and,
Overlap is the requisite overlap.

Windage 1, Windage 2, Guard Band and Overlap are all expressed as units of distance, e.g., microns. Accordingly, the requisite guard band and overlap may be independently controlled.

It will be understood by those having skill in the art that the method of FIG. 4 was described relative to a photomask pattern in which the primitive shapes were rectangles. However, the invention will also apply to other primitive shapes, e.g., circles parallelograms, etc. Selective irradiation deflection generators which are not vector scan rectangle generators, will still require the method of the present invention, because guard banded, partially overlapped inspection patterns are needed. Thus, for example, the inspection scan data for a continuous sweep, round spot, raster scan deflection generator would consist of functions that would provide the required guard band and overlap necessary to maintain the raster line-to-line separation in the direction perpendicular to the raster sweep and the overlap necessary to maintain sweep continuity in the direction of the sweep. It will also be noted that the overlap may be different along different directions.

Referring now to FIG. 6, there is illustrated a geometric example for windaging a given rectangle. As shown in FIG. 6, a rectangle 39 may be specified by the X-Y coordinates of its lower left hand corner plus its width and height. The formulas for applying a given positive or negative windage are also shown in FIG. 6. In order to apply a given positive windage (rectangle 41) or negative windage (rectangle 42) defined as adding or subtracting A units per rectangle side, respectively, the windaged rectangle parameters (X, Y, W, H) are as shown. Of course it will be understood by those having skill in the art that a rectangle can be specified in other ways, e.g., by giving the X-Y coordinates of non-adjacent corners, and that windaged rectangle parameters will be calculated accordingly.

Figure 7:
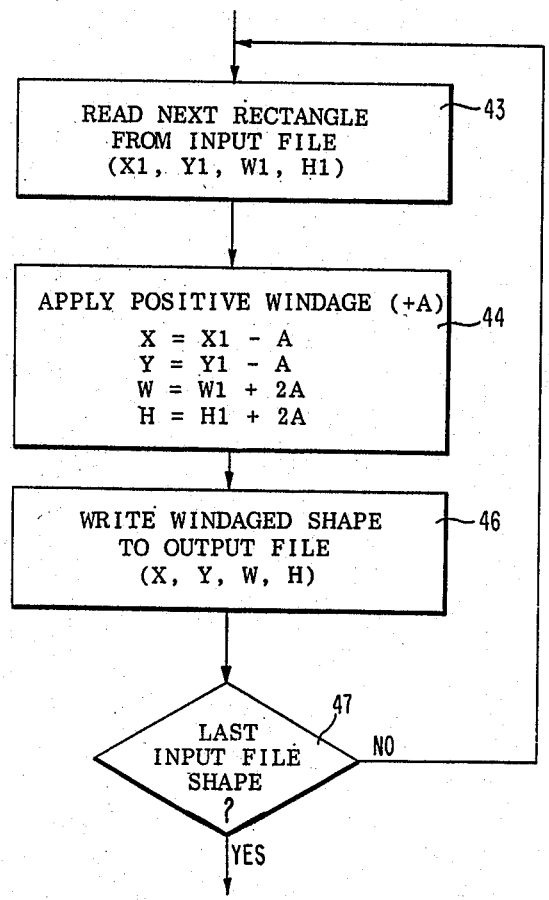
FIG. 7 illustrates a detailed method for performing windage.

Referring now to FIG. 7, the detailed steps in applying a positive windage (blocks 32 or 34 of FIG. 4) are illustrated. A shape is read from an input file of rectangle data (block 43). A positive windage is applied (block 44). The positive windaged parameters are then written to an output file (block 46). Succeeding rectangles are read and processed until the last rectangle has been processed (block 47).

Figure 8:
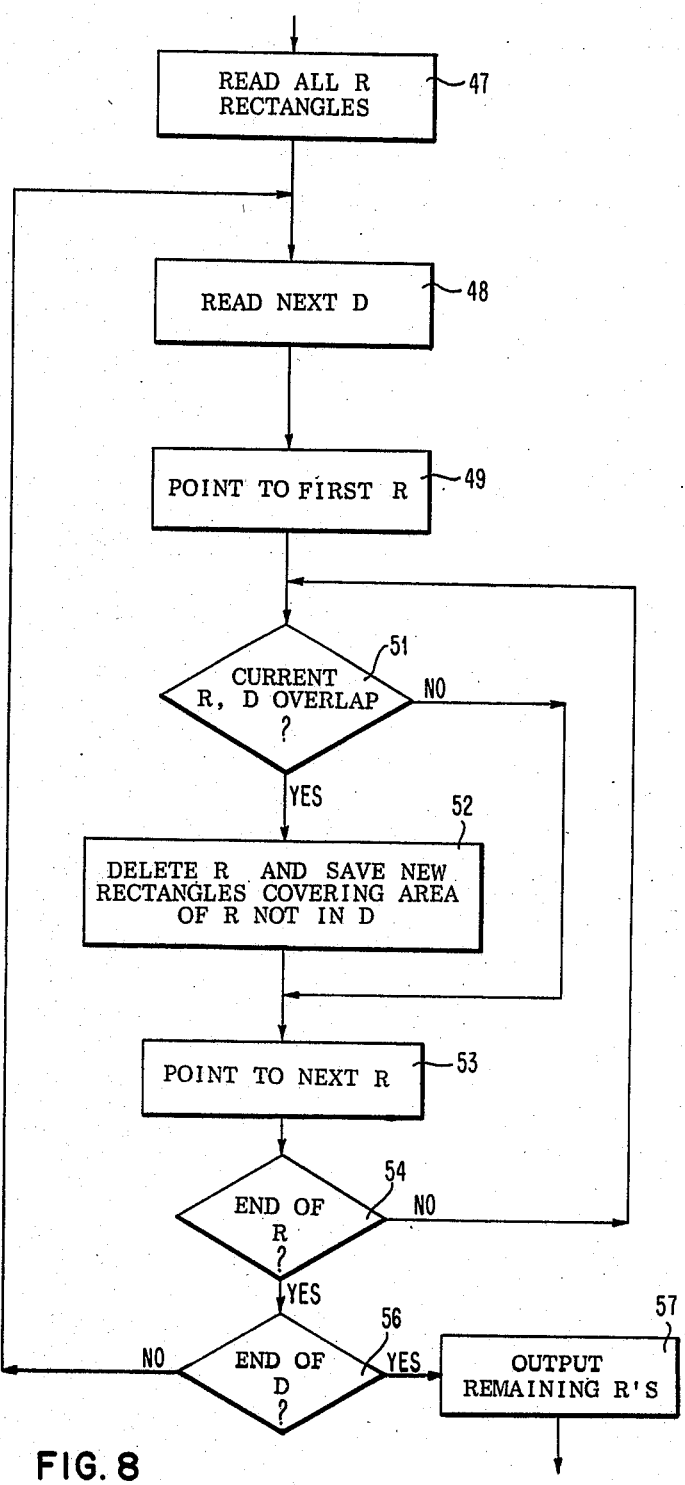
FIG. 8 illustrates a detailed method for performing inversion.
Figure 9A:
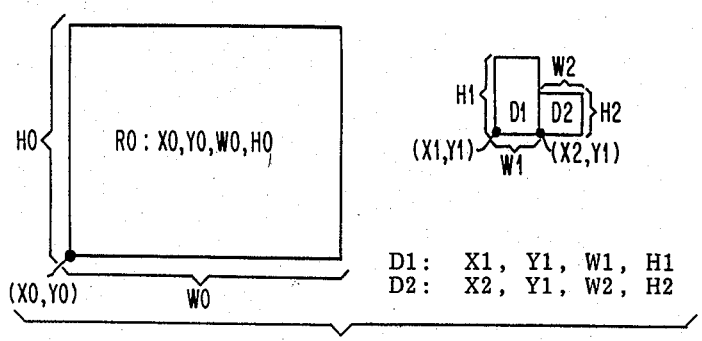
FIG. 9 geometrically illustrates the inversion operation.
Figure 9B:
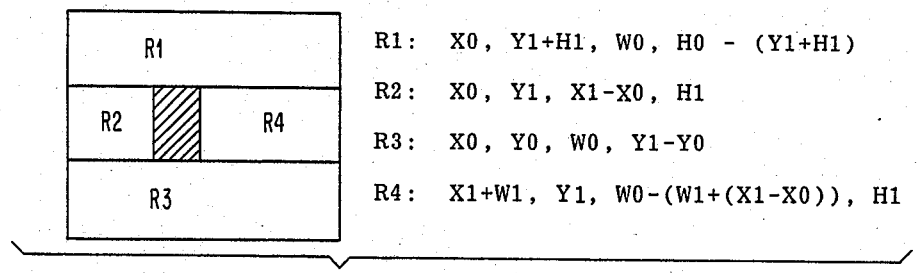
Figure 9C:
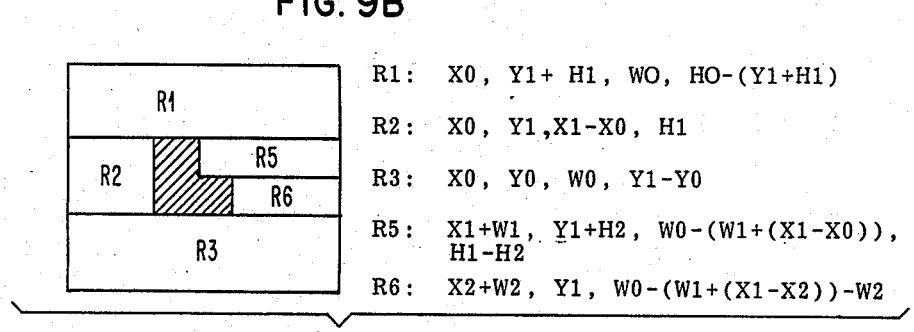

Referring now to FIG. 8, a detailed method for performing inversion (blocks 31 and 33 of FIG. 4) is illustrated in conjunction with a geometric example shown in FIG. 9. However, it will be understood by those having skill in the art that other methods for performing inversion may be employed in connection with the present invention. The example of FIG. 9 illustrates inversion of an L-shaped pattern comprising rectangles D1 and D2 having parameters (X1,Y1,W1,H1) and X2,Y2,W2,H2), respectively, the total region of interest R0 having parameters (X0,Y0,W0,H0). More particularly, inversion proceeeds by inputting the coordinates of all the region rectangles, here R0 (block 47, see also FIG. 9A). Then, (block 48) a first pattern rectangle is read, here D1. The first region (R0) is indexed (block 49) and it is determined if this current region and the pattern rectangle overlap (block 51). If they do, (block 52) then the first R is deleted from the list of R's and the new rectangle covering the area of R not in D is saved. This operation is illustrated in FIG. 9B wherein R0 is deleted and R1, R2, R3 and R4 are saved. Thus, D1 has been removed. Then (block 53), the next region R is pointed to (here there are none). When all the regions R have been processed (block 54), the next pattern rectangle D is processed (block 56) as was described above for the first pattern rectangle D1. Referring to FIG. 9C, in the second pass, D2 is removed R5 and R6 are created and R4 is removed. At the end of processing (block 57), all pattern rectangles D have been eliminated, and the regions R are output as the inverted region. Accordingly, the result of an inversion operation is a series of rectangles comprising all the area not included by the original set of rectangles.

Figure 10A:
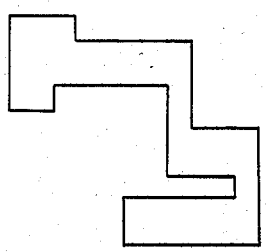
FIG. 10 geometrically illustrates a vertical combing operation for converting a polygon into a series of abutting rectangles.
Figure 10B:
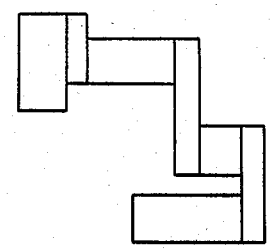

It will be understood by those having skill in the art that the invention assumes that the photomask patterns 28 (FIG. 4) are expressed as a series of primitive shapes as is typically the case for digital signal processing. If not, the complex photomask patterns must be converted to primitive shapes. Thus, for example, if the photomask patterns are described in terms of a polygon, a vertical combing operation may be performed in order to convert the polygon into a series of rectangles. Vertical combing examines each corner of a polygon, and makes a vertical extension for the corner to the nearest edge across the interior of the polygon. FIG. 10A illustrates a polygon photomask pattern, and FIG. 10B illustrates the resulting series of rectangles after vertical combing. It will also be understood that horizontal or other combing techniques may be employed. Likewise, if the results of an inversion operation are not expressed as a series of rectangles, a polygon to rectangle conversion step must be inserted after inversion; i.e., between blocks 31 and 32 and between blocks 33 and 34 of FIG. 4.

It should be clearly understood that the invention can be used with many other patterned workpieces and can employ means other than electron beams for inspection. Thus, optical, infrared, X-ray or the like could be used. Also, transmissive or reflective workpieces may be used. It will also be understood that the inspection equipment may require or use a form of radiation which would be different from that employed for exposure purposes. Thus, for example, reflective electron beams can be used for inspection while a transmissive optical beam can be used for exposure purposes.

While the invention has been particularly shown and described with reference to a preferred embodiment thereof, it will be understood by those skilled in the art that various changes in form and details may be made without departing from the spirit and scope of the invention.

We claim:

1. A method of inspecting a pattern on a workpiece, said pattern being formed of a plurality of primitive shapes represented by a first set of coordinate data, comprising the steps of:

enlarging each of said primitive shapes by applying a first positive windage to said first set of coordinate data to obtain a second set of coordinate data representing a first modified pattern of overlapping shapes;

inverting said second set of coordinate data to obtain a third set of coordinate data representing a second modified pattern which is the complement of said first modified pattern;

applying a second positive windage to said third set of coordinate data to obtain a fourth set of coordinate data representing a third modified pattern;

applying said fourth set of coordinate data to the deflection means of a selective irradiation tool having said workpiece mounted in the target area thereof to cause a beam of radiation produced thereby to scan said workpiece in said third modified pattern represented by said fourth set of coordinate data; and monitoring the radiation backscattered from or transmitted through said workpiece to detect any defects in said workpiece pattern.

2. The method of claim 1, further comprising:

inverting said first set of coordinate data before applying said first positive windage thereto to obtain a fifth set of coordinate data representing a fourth modified pattern from said second positive windage step; and applying said fifth set of coordinate data to said selective irradiation tool deflection means to scan said workpiece in said fourth modified pattern.

3. The method of claim 1 wherein said fourth set of coordinate data is applied to the deflection means of an electron beam tool.

4. The method of claim 1 wherein said step of applying said first positive windage includes setting the amount of said first positive windage equal to the sum of a predetermined guard band plus one-half of a predetermined overlap for said primitive shapes forming said workpiece pattern, and setting the amount of said second positive windage equal to one-half of said predetermined overlap.

5. The method of claim 2 wherein said fourth set of coordinate data is applied to the deflection means of an electron beam tool.

6. The method of claim 2 wherein said step of applying said first positive windage includes setting the amount of said first positive windage equal to the sum of a predetermined guard band plus one-half of a predetermined overlap for said primitive shapes forming said workpiece pattern, and setting the amount of said second positive windage equal to one-half of said predetermined overlap.

* * * * *